United States Patent
Isaak et al.

(10) Patent No.: US 6,878,571 B2
(45) Date of Patent: Apr. 12, 2005

(54) PANEL STACKING OF BGA DEVICES TO FORM THREE-DIMENSIONAL MODULES

(75) Inventors: Harlan R. Isaak, Costa Mesa, CA (US); Andrew C. Ross, Ramona, CA (US); Glen E. Roeters, Huntingdon Beach, CA (US)

(73) Assignee: Staktek Group L.P., Austin, TX (US)

( * ) Notice: Subject to any disclaimer, the term of this patent is extended or adjusted under 35 U.S.C. 154(b) by 313 days.

(21) Appl. No.: 10/316,566

(22) Filed: Dec. 11, 2002

(65) Prior Publication Data

US 2003/0127746 A1 Jul. 10, 2003

Related U.S. Application Data

(60) Division of application No. 10/017,553, filed on Dec. 14, 2001, now Pat. No. 6,566,746, which is a continuation-in-part of application No. 09/598,343, filed on Jun. 21, 2000, now Pat. No. 6,404,043.

(51) Int. Cl.[7] .............................................. H01L 21/44
(52) U.S. Cl. ...................... 438/107; 438/109; 438/111; 438/121; 438/129
(58) Field of Search ............................... 438/107, 109, 438/111, 121, 129

(56) References Cited

U.S. PATENT DOCUMENTS

| | | |
|---|---|---|
| 3,746,934 A | 7/1773 | Stein |
| 3,723,977 A | 3/1973 | Schaufele |
| 4,851,695 A | 7/1989 | Stein |
| 4,956,694 A | 9/1990 | Eide |
| 5,128,831 A | 7/1992 | Fox, III et al. |
| 5,198,888 A | 3/1993 | Sugano et al. |
| 5,201,451 A | 4/1993 | Desai et al. |
| 5,231,304 A | 7/1993 | Solomon |
| 5,239,447 A | 8/1993 | Cotues et al. |
| 5,269,453 A | 12/1993 | Melton et al. |
| 5,282,565 A | 2/1994 | Melton |
| 5,284,796 A | 2/1994 | Nakanishi |
| 5,311,401 A | 5/1994 | Gates, Jr. et al. |
| 5,313,096 A | 5/1994 | Eide |
| 5,324,569 A | 6/1994 | Nagesh et al. |
| 5,328,087 A | 7/1994 | Nelson et al. |
| 5,373,189 A | 12/1994 | Massit et al. |
| 5,384,689 A | 1/1995 | Shen |
| 5,454,160 A | 10/1995 | Nickel |
| 5,514,907 A | 5/1996 | Moshayedi |
| 5,607,538 A | 3/1997 | Cooke |

(Continued)

Primary Examiner—Lynne A. Gurley
(74) Attorney, Agent, or Firm—Andrews Kurth L.L.P.

(57) ABSTRACT

A chip stack comprising at least one base layer including a base substrate having a first conductive pattern disposed thereon. The chip stack further comprises at least one interconnect frame having a second conductive pattern disposed thereon which is electrically connected to the first conductive pattern of the base layer. Also included in the chip stack are at least two integrated circuit chip packages. The integrated circuit chip packages may each be electrically connected to the first conductive pattern of the base layer such that one of the integrated circuit chip packages is at least partially circumvented by the interconnect frame. Alternatively, one of the integrated circuit chip packages may be electrically connected to the first conductive pattern, with the remaining integrated circuit chip package being attached to the base substrate and at least partially circumvented by the interconnect frame such that the circumvented integrated circuit chip package and the second conductive pattern of the interconnect frame collectively define a composite footprint for the chip stack. A transposer layer may be included as a portion of each chip stack, with the transposer layer including a third conductive pattern specifically configured to provide a CSP-TSOP interface.

6 Claims, 4 Drawing Sheets

U.S. PATENT DOCUMENTS

| | | |
|---|---|---|
| 5,612,570 A | 3/1997 | Eide et al. |
| 5,700,715 A | 12/1997 | Pasch |
| 5,712,767 A | 1/1998 | Koizumi |
| 5,731,633 A | 3/1998 | Clayton |
| 5,759,046 A | 6/1998 | Ingrahm et al. |
| 5,818,106 A | 10/1998 | Kunimatsu |
| 5,869,353 A | 2/1999 | Levy et al. |
| 5,869,896 A | 2/1999 | Baker et al. |
| 5,930,603 A | 7/1999 | Tsuji et al. |
| 5,950,304 A | 9/1999 | Khandros et al. |
| 6,057,381 A | 5/2000 | Ma et al. |
| 6,404,043 B1 * | 6/2002 | Isaak .......................... 257/686 |
| 6,472,735 B2 * | 10/2002 | Isaak .......................... 257/686 |
| 6,544,815 B2 * | 4/2003 | Isaak .......................... 438/109 |
| 6,566,746 B2 * | 5/2003 | Isaak et al. ................. 257/685 |

\* cited by examiner

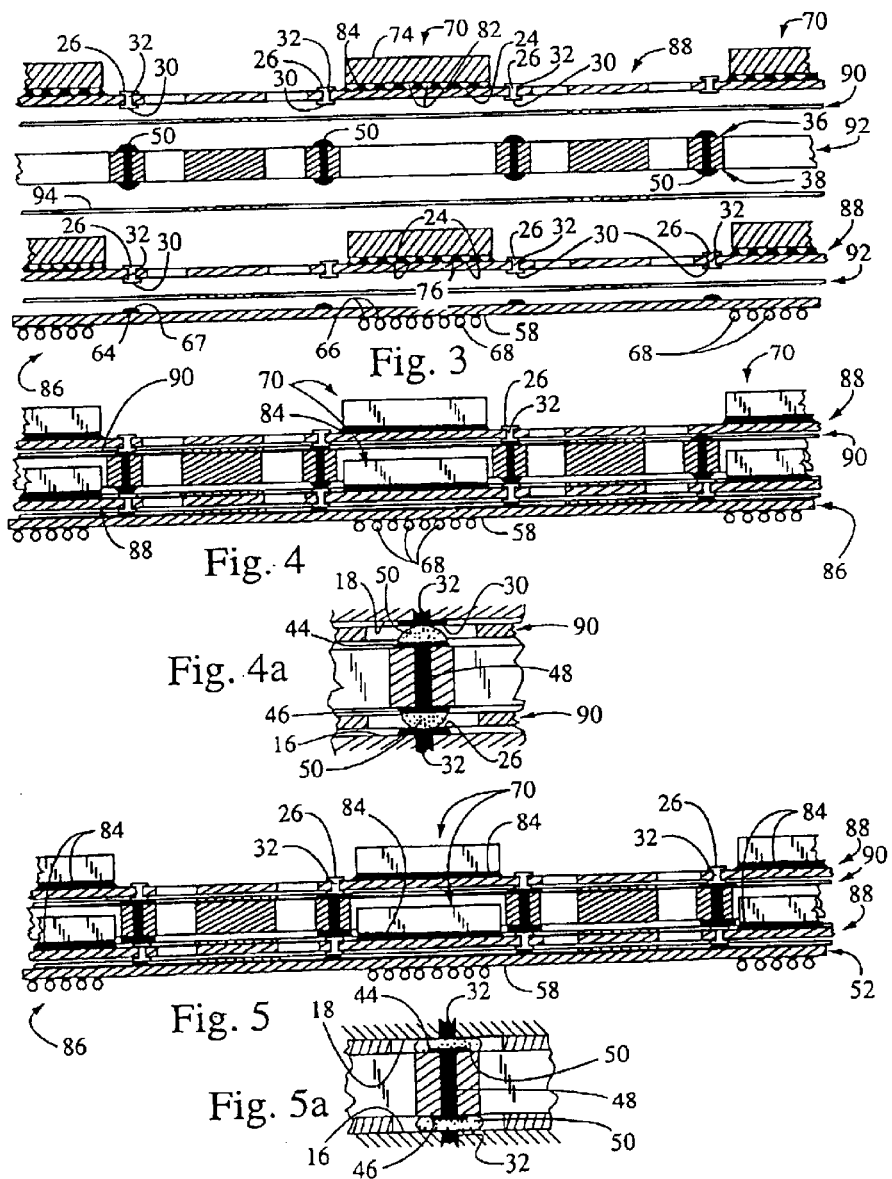

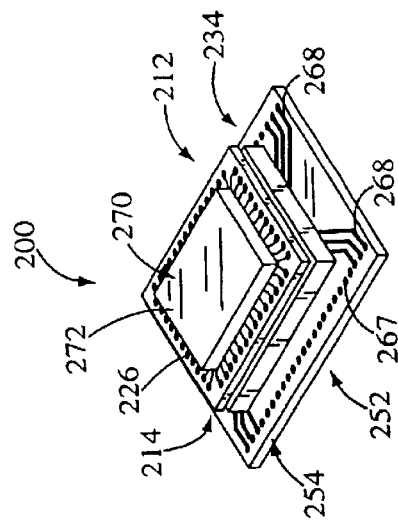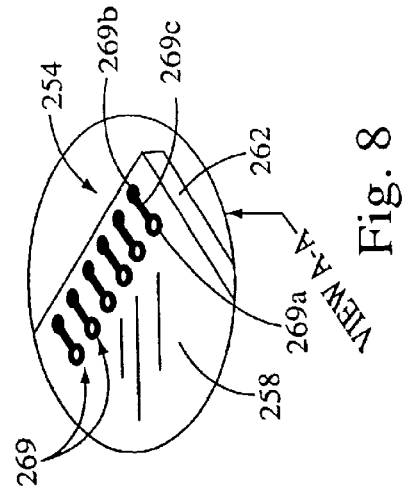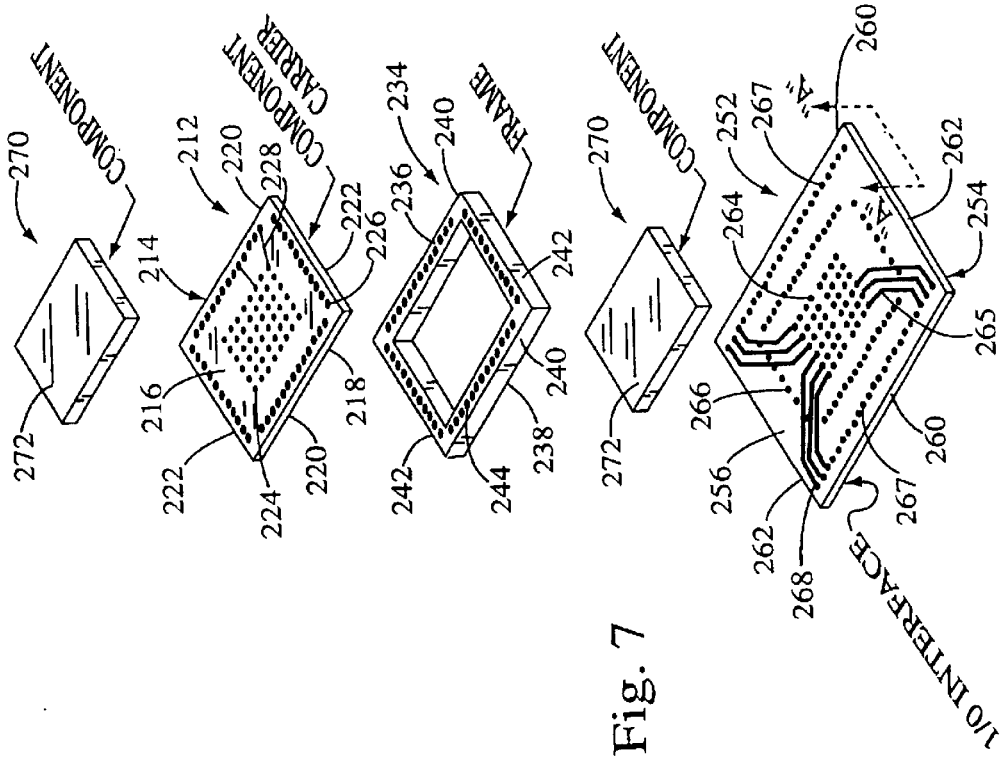

PANEL STACKING OF BGA DEVICES TO FORM THREE-DIMENSIONAL MODULES

CROSS-REFERENCE TO RELATED APPLICATIONS

This application is a division application of U.S. patent application Ser. No. 10/017,553 filed Dec. 14, 2001 now U.S. Pat. No. 6,566,746, which is a continuation-in-part of U.S. patent application Ser. No. 09/598,343 filed Jun. 21, 2000 now U.S. Pat. No. 6,404,043.

STATEMENT RE: FEDERALLY SPONSORED RESEARCH/DEVELOPMENT (Not Applicable)

BACKGROUND OF THE INVENTION

The present invention relates generally to chip stacks, and more particularly to a chip stack having connections routed from the bottom to the perimeter thereof to allow multiple integrated circuit chips such as BGA devices to be quickly, easily and inexpensively vertically interconnected in a volumetrically efficient manner.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a volumetrically efficient chip stack. In the chip stack of the present invention, connections are routed from the bottom of the chip stack to the perimeter thereof so that interconnections can be made vertically which allows multiple integrated circuit chips such as BGA, CSP, fine pitch BGA, or flip chip devices to be stacked in a manner providing the potential for significant increases in the production rate of the chip stack and resultant reductions in the cost thereof.

BRIEF SUMMARY OF THE INVENTION

In accordance with the present invention, there is provided a chip stack comprising a base layer which includes a base substrate having a first conductive pattern disposed thereon. The chip stack further comprises at least one interconnect frame having a second conductive pattern disposed thereon which is electrically connected to the first conductive pattern of the base layer. Also included in the chip stack is a transposer layer which itself comprises a transposer substrate having a third conductive pattern disposed thereon. The third conductive pattern of the transposer substrate is electrically connected to the second conductive pattern of the interconnect frame. In addition to the base and transposer layers and interconnect frame, the chip stack comprises at least two integrated circuit chip packages which are electrically connected to respective ones of the first and third conductive patterns. The interconnect frame is disposed between the base and transposer layers, with one of the integrated circuit chip packages being at least partially circumvented by the interconnect frame. The integrated circuit chip packages may each comprise a CSP device, with the third conductive pattern of the transposer layer being uniquely sized and configured to provide a TSOP interface for the chip stack.

Further in accordance with the present invention, there is provided a chip stack comprising a base layer which includes a base substrate having a first conductive pattern disposed thereon. In addition to the base layer, the chip stack comprises at least one interconnect frame having a second conductive pattern disposed thereon which is electrically connected to the first conductive pattern of the base layer and electrically connectable to another component. In addition to the base layer and interconnect frame, the chip stack comprises at least two integrated circuit chip packages. One of the integrated circuit chip packages is electrically connected to the first conductive pattern of the base layer, with the remaining one of the integrated circuit chip packages being attached (as opposed to electrically connected) to an opposed side of the base substrate and at least partially circumvented by the interconnect frame. Each of the integrated circuit chip packages includes a plurality of conductive contacts, with the second conductive pattern of the interconnect frame and the conductive contacts of the integrated circuit chip package circumvented thereby collectively defining a composite footprint of the chip stack which is electrically connectable to another component.

Still further in accordance with the present invention, there is provided a chip stack comprising a base layer including a base substrate having a first conductive pattern disposed thereon. The chip stack further comprises at least one interconnect frame having a second conductive pattern disposed thereon which is electrically connected to the first conductive pattern of the base layer and electrically connectable to another component. Also included in the chip stack are at least two integrated circuit chip packages which are each electrically connected to the first conductive pattern and disposed on opposed sides of the base substrate. One of the integrated circuit chip packages is at least partially circumvented by the interconnect frame.

BRIEF DESCRIPTION OF THE DRAWINGS

These, as well as other features of the present invention, will become more apparent upon reference to the drawings wherein:

FIG. 3 is an exploded view of the various components which are stacked upon each other in accordance with a preferred method of assembling the chip stack of the present invention;

FIG. 4 is a partial cross-sectional view of the components shown in FIG. 3 as stacked upon each other prior to a solder reflow step of the present assembly method;

FIG. 4a is an enlargement of the encircled region 4a shown in FIG. 4;

FIG. 5 is partial cross-sectional view similar to FIG. 4 illustrating the components shown in FIG. 3 as stacked upon each other subsequent to the completion of the solder reflow step of the present assembly method;

FIG. 5a is an enlargement of the encircled region 5a shown in FIG. 5;

FIG. 6 is a top perspective view of a chip stack constructed in accordance with a second embodiment of the present invention;

FIG. 7 is an exploded view of the chip stack shown in FIG. 6;

FIG. 8 is a partial perspective view of the transposer layer of the chip stack shown in FIG. 7 taken along line A—A thereof;

DETAILED DESCRIPTION OF THE INVENTION

Figures 1, 2:
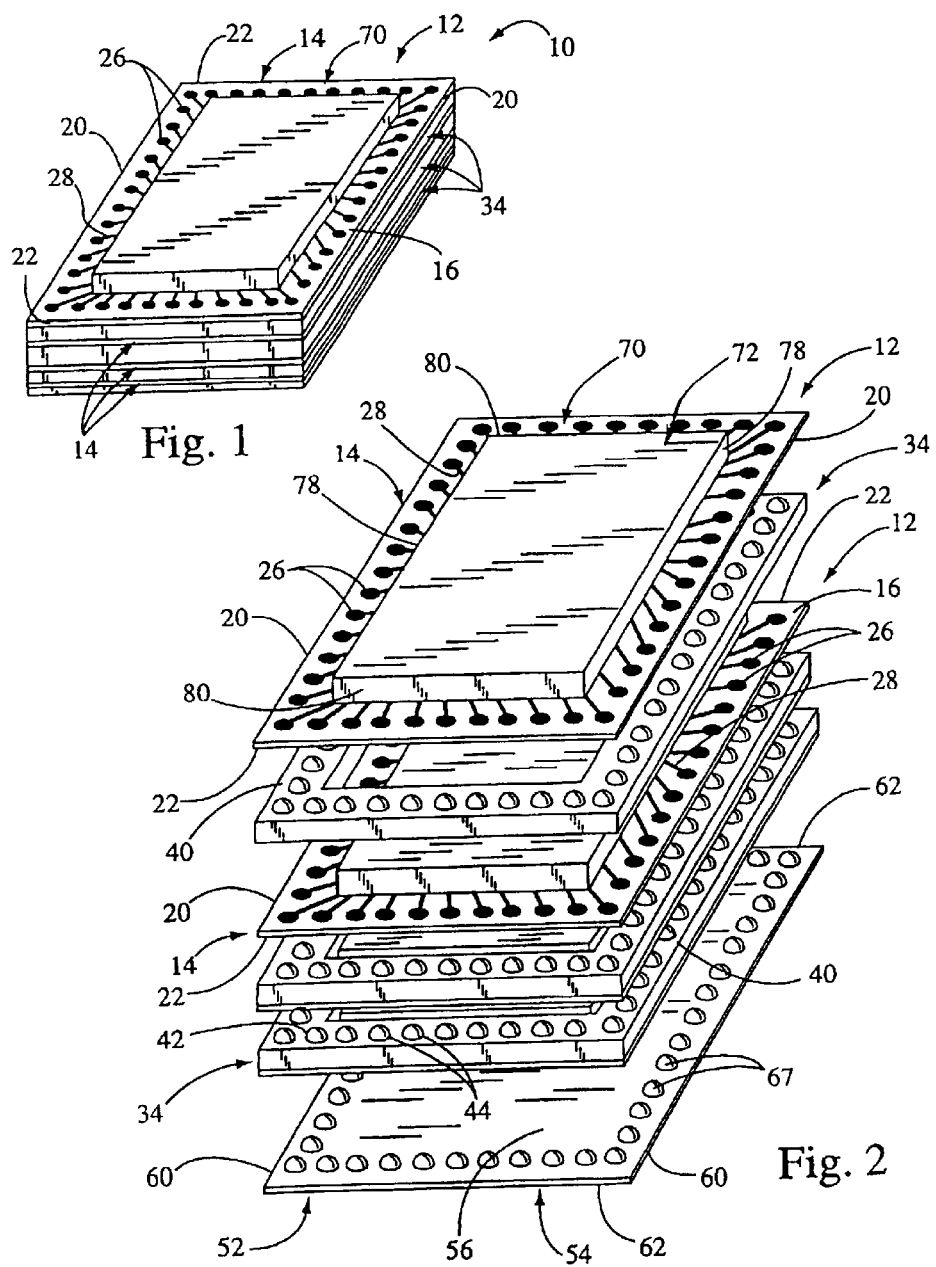
FIG. 1 is a top perspective view of a chip stack constructed in accordance with the present invention.
FIG. 2 is an exploded view of the chip stack shown in FIG. 1.

Referring now to the drawings wherein the showings are for purposes of illustrating preferred embodiments of the present invention only, and not for purposes of limiting the same, FIG. 1 perspectively illustrates a chip stack 10 assembled in accordance with a first embodiment of the present invention. The chip stack 10 comprises at least two identically configured base layers 12. Each of the base layers 12 itself comprises a rectangularly configured base substrate 14 which defines a generally planar top surface 16, a generally planar bottom surface 18, an opposed pair of longitudinal peripheral edge segments 20, and an opposed pair of lateral peripheral edge segments 22.

Disposed on the base substrate 14 of each base layer 12 is a first conductive pattern which itself preferably comprises a first set of base pads 24 and a second set of base pads 26 which are each disposed on the top surface 16 of the base substrate 14. The base pads 24 of the first set are preferably arranged in a generally rectangular pattern or array in the central portion of the base substrate 14, with the base pads 26 of the second set extending linearly along the longitudinal and lateral peripheral edge segments 20, 22 of the base substrate 14. The base pads 24 of the first set are electrically connected to respective ones of the base pads 26 of the second set via conductive traces 28. In addition to the base pads 24, 26 of the first and second sets, the first conductive pattern of each base layer 12 comprises a third set of base pads 30 which is disposed on the bottom surface 18 of the base substrate 14. The base pads 30 of the third set are preferably arranged in an identical pattern to the base pads 26 of the second set, and extend linearly along the longitudinal and lateral peripheral edge segments 20, 22 of the base substrate 14 such that each of the base pads 30 of the third set is aligned with and electrically connected to a respective one of the base pads 26 of the second set.

As is best seen in FIGS. 3–5, each of the base pads 26 of the second set is electrically connected to a respective one of the base pads 30 of the third set via a base feed-through hole 32. Each base feed-through hole 32 is preferably plugged with a conductive material. The conductive material is preferably selected from the group consisting of nickel, gold, tin, silver epoxy, and combinations thereof. The base pads 26, 30 of the second and third sets, as well as the base pads 24 of the first set, each preferably have a generally circular configuration. In this respect, each base feed-through hole 32 preferably extends axially between each corresponding, coaxially aligned pair of the base pads 26, 30 of the second and third sets. The base pads 26, 30 of the second and third sets are preferably formed upon (i.e., surface plated to) the base substrate 14 subsequent to the plugging of the base feed-through holes 32 and are used to cover the opposed, open ends thereof. If the base feed-through holes 32 were left unplugged, solder coming into contact with the base pads 26, 30 of the second and third sets would tend to wick into the base feed-through holes 32 upon the reflow of the solder (which will be discussed below), thus robbing the base pads 26, 30 of solder needed to facilitate various electrical connections in the chip stack 10.

In addition to the base layers 12, the chip stack 10 of the present invention comprises at least one rectangularly configured interconnect frame 34. The interconnect frame 34 defines a generally planar top surface 36, a generally planar bottom surface 38, an opposed pair of longitudinal side sections 40, and an opposed pair of lateral side sections 42. Disposed on the interconnect frame 34 is a second conductive pattern which itself preferably comprises a first set of frame pads 44 disposed on the top surface 36, and a second set of frame pads 46 disposed on the bottom surface 38. The frame pads 44, 46 of the first and second sets are preferably arranged in patterns which are identical to each other, and to the patterns of the second and third sets of base pads 26, 30 of each of the base layers 12. In this respect, the frame pads 44, 46 of the first and second sets each extend linearly along the longitudinal and lateral side sections 40, 42 of the interconnect frame 34, with each of the frame pads 44 of the first set being aligned with and electrically connected to a respective one of the frame pads 46 of the second set. As best seen in FIGS. 4(a) and 5(a), similar to the electrical connection of the base pads 26, 30 of the second and third sets to each other, the electrical connection of each of the frame pads 44 of the first set to a respective one of the frame pads 46 of the second set is preferably accomplished via a frame feed-through hole 48 which is also preferably plugged with a conductive material. The conductive material is preferably selected from the same group used as the conductive material to plug the base feed-through holes 32, i.e., nickel, gold, tin, silver epoxy, and combinations thereof. Each of the frame feed-through holes 48 preferably extends axially between a corresponding, coaxially aligned pair of the frame pads 44, 46 of the first and second sets, with the plugging of the frame feed-through holes 48 preferably occurring prior to the surface plating of the frame pads 44, 46 of the first and second sets to respective ones of the top and bottom surfaces 36, 38 of the interconnect frame 34.

In the preferred embodiment, the interconnect frame 34 is preferably prepared for use in the chip stack 10 by forming generally semi-spherically shaped solder bumps 50 on each of the frame pads 44, 46 of the first and second sets. These solder bumps 50 are preferably formed by first stenciling solder paste onto the frame pads 44, 46 of the first and second sets, and thereafter reflowing the solder paste to form the solder bumps 50. The use of a six mil thick stencil with an aperture approximately the same size as each of the frame pads 44, 46 will facilitate the formation of a solder bump 50 approximately six mils high. As indicated above, the frame pads 44, 46 of the first and second sets are formed (i.e., surface plated) subsequent to the frame feed-through holes 48 being plugged with the conductive material. If the frame feed-through holes 48 were left unplugged, each frame feed-through hole 48 could trap flux or air which would blow out the solder during the reflow cycle used to form the solder bumps 50 on each corresponding, coaxially aligned pair of frame pads 44, 46 of the first and second sets.

In the chip stack 10, the interconnect frame 34 is disposed between the base layers 12, with the second conductive pattern of the interconnect frame 34 being electrically connected to the first conductive pattern of each of the base layers 12. More particularly, the frame pads 46 of the second set are electrically connected to respective ones of the base pads 26 of the second set of one of the base layers 12 (i.e., the base layer 12 immediately below the interconnect frame 34 in the chip stack 10), with the frame pads 44 of the first set being electrically connected to respective ones of the base pads 30 of the third set of one of the base layers 12 (i.e., the base layer 12 immediately above the interconnect frame 34 in the chip stack 10). Due to the base pads 26, 30 of the second and third sets and the frame pads 44, 46 of the first and second sets all being arranged in identical patterns, each coaxially aligned pair of frame pads 44, 46 of the first and second sets is itself coaxially aligned with a coaxially aligned set of base pads 26, 30 of the second and third sets of each of the adjacent base layers 12. The electrical connection of the second conductive pattern of the interconnect frame 34 to the first conductive pattern of each of the adjacent base layers 12 is preferably facilitated via a soldering process which will be described in more detail below.

The chip stack 10 of the present invention further preferably comprises a transposer layer 52. The transposer layer 52 itself comprises a rectangularly configured transposer substrate 54 which defines a generally planar top surface 56, a generally planar bottom surface 58, an opposed pair of longitudinal peripheral edge segments 60, and an opposed pair of lateral peripheral edge segments 62. Disposed on the transposer substrate 54 is a third conductive pattern. The third conductive pattern comprises a first set of transposer pads 64 which are disposed on the top surface 56 of the transposer substrate 54, and a second set of transposer pads 66 which are disposed on the bottom surface 58 thereof. The transposer pads 64 of the first set are electrically connected to respective ones of the transposer pads 66 of the second set via conductive traces. The transposer pads 64 of the first set are preferably arranged in a pattern which is identical to the patterns of the second and third sets of base pads 26, 30 and the first and second sets of frame pads 44, 46. In this respect, the transposer pads 64 of the first set extend linearly along the longitudinal and lateral peripheral edge segments 60, 62 of the transposer substrate 54. The transposer pads 66 of the second set are themselves preferably arranged in a generally rectangular pattern or array in the central portion of the bottom surface 58 of the transposer substrate 54, with the pattern of the transposer pads 66 of the second set preferably being identical to the pattern of the base pads 24 of the first set of each of the base layers 12.

In the preferred embodiment, the transposer layer 52 is prepared for use in the chip stack 10 by forming generally spherically shaped solder balls 68 on each of the transposer pads 66 of the second set. These solder balls 68 are preferably formed by stencil printing solder paste onto each of the transposer pads 66 of the second set, and thereafter reflowing the solder paste to form the solder balls 68. The aperture in the stencil used to form the solder balls 68 is typically larger than each of the transposer pads 66 and thick enough to deposit sufficient solder to form the solder balls 68. As seen in FIG. 3, the transposer layer 52 is also prepared for use in the chip stack 10 by forming generally semi-spherically shaped solder bumps 67 on each of the transposer pads 64 of the first set. These solder bumps 67 are preferably formed in the same manner previously described in relation to the formation of the solder bumps 50 on the frame pads 44, 46 of the first and second sets.

In the chip stack 10, the first conductive pattern of one of the base layers 12 (i.e., the lowermost base layer 12 in the chip stack 10) is electrically connected to the third conductive pattern of the transposer layer 52. More particularly, each of the base pads 30 of the third set of the lowermost base layer 12 is electrically connected to a respective one of the transposer pads 64 of the first set. Due to the base pads 30 of the third set and the transposer pads 64 of the first set being arranged in identical patterns, each of the base pads 30 of third set is coaxially alignable with a respective one of the transposer pads 64 of the first set, with the electrical connection therebetween preferably being facilitated via soldering as will be discussed in more detail below.

In the present chip stack 10, the base pads 24, 26, 30 of the first, second and third sets, the conductive traces 28, the frame pads 44, 46 of the first and second sets, and the transposer pads 64, 66 of the first and second sets are each preferably fabricated from very thin copper having a thickness in the range of from about five microns to about twenty-five microns through the use of conventional etching techniques. Advantageously, the use of thin copper for the various pads and traces 28 allows for etching line widths and spacings down to a pitch of about 4 mils which substantially increases the routing density on each of the base layers 12, as well as the transposer layer 52. Additionally, the base substrate 14, the interconnect frame 34, and the transposer substrate 54 are each preferably fabricated from either FR-4, polyamide, or some other suitable material which can easily be routed. As indicated above, all of the base feed-through holes 32 and frame feed-through holes 43 are plugged with a conductive material prior to the surface plating procedure used to form the base pads 24, 26, 30 of the first, second and third sets, and the frame pads 44, 46 of the first and second sets. The material used to form each base substrate 14 and/or the transposer substrate 54 may be as thin as about 0.010 inches or may be a thicker multilayer structure.

The chip stack 10 of the present invention further comprises at least two identically configured integrated circuit chips 70 which are electrically connected to respective ones of the first conductive patterns of the base layers 12. Each of the integrated circuit chips 70 preferably comprises a rectangularly configured body 72 defining a generally planar top surface 74, a generally planar bottom surface 76, an opposed pair of longitudinal sides 78, and an opposed pair of lateral sides 80. Disposed on the bottom surface 76 of the body 72 are a plurality of generally spherically shaped conductive contacts 82 which are preferably arranged in a pattern identical to the patterns of the base pads 24 of the first set and the transposer pads 66 of the second set. The conductive contacts 82 of each of the integrated circuit chips 70 are electrically connected to respective ones of the base pads 24 of the first set of a respective one of the first conductive patterns of the base layers 12. Due to the conductive contacts 82 and base pads 24 of each of the first sets being arranged in identical patterns, the conductive contacts 82 of each of the integrated circuit chips 70 are coaxially alignable with respective ones of the base pads 24 of the corresponding first set. In each of the integrated circuit chips 70, solder is preferably pre-applied to each of the conductive contacts 82 thereof. The electrical connection of the conductive contacts 82 of each integrated circuit chip 70 to respective ones of the base pads 24 of the first set of a respective one of the first conductive patterns is preferably accomplished via soldering in a manner which will be discussed in more detail below. Additionally, each of the integrated circuit chips 70 is preferably a BGA (ball grid array) device, though the same may alternatively comprise either a CSP device or a flip chip device.

In the present chip stack 10, a layer 84 of flux/underfill is preferably disposed between the bottom surface 76 of the body 72 of each of the integrated circuit chips 70 and respective ones of the top surfaces 16 of the base substrates 14. Each layer 84 of the flux/underfill is preferably spread over the base pads 24 of the first set of a respective one of the first conductive patterns of the base layers 12. Each layer 84 substantially encapsulates the conductive contacts 82 of the corresponding integrated circuit chip 70 when the same is electrically connected to the first conductive pattern of a respective one of the base layers 12.

Prior to the attachment of the integrated circuit chip 70 to a respective base layer 12, a bakeout cycle is required to drive out the moisture in the base layer 12 and the corresponding integrated circuit chip 70. A cycle of approximately eight hours at about 125° Celsius is desirable, which is followed by storage in a dry nitrogen atmosphere until use. The first step in the attachment of the integrated circuit chip 70 to the corresponding base layer 12 is the precise deposition of the layer 84 of an appropriate flux/underfill material over the base pads 24 of the corresponding first set. The integrated circuit chip 70 is then placed over the pad area, squeezing out the flux/underfill material of the layer 84 to the longitudinal and lateral sides 78, 80 of the body 72 and seating the conductive contacts 82 onto respective ones of the base pads 24 of the corresponding first set. If done properly, the layer 84 of the flux/underfill material, when cured, will have no voids or minimum voids. The base layer 12 having the integrated circuit chip 70 positioned thereupon in the above-described manner is then run through a solder reflow cycle with no dwelling time at an intermediate temperature of approximately 150° Celsius. A post cure cycle to complete the polymerization of the layer 84 of the flux/underfill material may be required depending on the particular flux/underfill material used in the layer 84. At this juncture, the base layer 12 having the integrated circuit chip 70 electrically connected thereto may be electrically tested.

In the prior art, the standard approach for the attachment or electrical connection of the conductive contacts of a BGA device to an attachment or pad site is to first flux the pad site or conductive contacts of the BGA device, place the BGA device on the pad site in the proper orientation, reflow the solder pre-applied to the conductive contacts of the BGA device to facilitate the electrical connection to the pad site, clean, then underfill and cure. The cleaning step typically requires considerable time since the gap under the bottom surface of the body of the BGA device is very small and very difficult to penetrate with standard cleaning methods. Also, the removal of the cleaning fluid (which is generally water) requires long bakeout times.

The underfill of an epoxy between the bottom surface of the body of the BGA device and the top surface of the substrate having the pad site thereon is a relatively easy procedure, but is very slow. If a no-clean flux is used for attachment, the residue from the flux typically becomes entrapped within the epoxy underfill and may cause corrosion problems. A subsequent solder reflow process to facilitate the attachment of the chip stack to a main printed circuit board (PCB) often causes the residue flux to vaporize which exerts pressure on the solder joints and could delaminate the structure. Most underfill materials become very hard (i.e., greater than ninety shore D) and are cured at a temperature of less than about 180° Celsius. The solder is solid at this temperature and the underfill encases the solder with no room for expansion. The solder from the conductive contacts of the BGA device expands when molten again, thus exerting pressure which can delaminate the structure. If the chip stack is not subjected to subsequent reflow temperatures when completed, there is no problem. However, the chip stack must be able to withstand the subsequent reflow temperature.

The flux/underfill material used for the layer 84 provides both flux and underfill properties with one formulation. As the temperature rises during the solder reflow process which will be discussed below, the flux characteristics of the material aid in the solder process, with extended exposure to the peak solder reflow temperature beginning the polymerization process of the underfill portion of the material. The flux is incorporated into the underfill, thus becoming one compatible material which is cured above the melting point of solder. Thus, there is room within the encased solder for expansion at the reflow temperature. No cleaning steps are required, though careful dispensing of the correct volume and accurate placement of the integrated circuit chip 70 upon its corresponding base layer 12 is critical.

The complete chip stack 10 shown in FIG. 1 includes a transposer layer 52, four base layers 12, three interconnect frames 34, and four integrated circuit chips 70. The first conductive pattern of the lowermost base layer 12 is electrically connected to the third conductive pattern of the transposer layer 52 in the above-described manner. Additionally, each of the interconnect frames 34 is disposed or positioned between an adjacent pair of base layers 12, with the second conductive pattern of each of the interconnect frames 34 being electrically connected to the first conductive pattern of such adjacent pair of base layers 12 in the above-described manner. Since the conductive contacts 82 of each of the integrated circuit chips 70 are electrically connected to respective ones of the base pads 24 of the first set of respective ones of the first conductive patterns, the integrated circuit chips 70 other than for the uppermost integrated circuit chip 70 are disposed between adjacent pairs of the base layers 12 and are each circumvented by a respective one of the interconnect frames 34. Thus, the bodies 72 of the integrated circuit chips 70 and the interconnect frames 34 are preferably sized relative to each other such that the top surface 74 of the body 72 of an integrated circuit chip 70 which is circumvented by an interconnect frame 34 does not protrude beyond the top surface 36 thereof.

As also indicated above, all the various electrical connections within the chip stack 10 are preferably facilitated via soldering. The transposer pads 66 of the second set, which are spherically shaped as indicated above, form a ball grid array on the bottom of the chip stack 10 which is specifically suited for facilitating the attachment of the chip stack 10 to a printed circuit board (PCB). Those of ordinary skill in the art will recognize that the chip stack 10 may be assembled to include fewer or greater than four base layers 12, three interconnect frames 34, and four integrated circuit chips 70.

Having thus described the structural attributes of the chip stack 10, the preferred method of assembling the same will now be described with specific reference to FIGS. 3, 4, 4(a), 5 and 5(a). In accordance with the present invention, multiple chip stacks 10 may be concurrently assembled through the use of a transposer panel 86, at least two base panels 88, at least one frame panel 90, at least three spacer sheets 92, and a plurality of integrated circuit chips 70. The transposer panel 86 is formed to include multiple groups of the first and second sets of transposer pads 64, 66 with such groups being formed on the transposer panel 86 in spaced relation to each other. Similarly, each of the base panels 88 is formed to include multiple groups of the first, second and third sets of base pads 24, 26, 30, with the frame panels 90 each being formed to include multiple groups of the first and second sets of frame pads 44, 46. As indicated above, the transposer panel 86 is prepared such that the transposer pads 64 of the first set of each group have the solder bumps 67 formed thereon, with the transposer pads 66 of the second set of each group having the solder balls 68 formed thereon. Similarly, each of the frame panels 90 is prepared such that the first and second sets of frame pads 44, 46 of each group have the solder bumps 50 formed thereon. The spacer sheets 92 are each formed to define a plurality of rectangularly configured openings 94, the length and width dimensions of which exceed those of the base and transposer substrates 14, 54 and interconnect frames 34 which are substantially equal to each other.

In a preferred assembly process, the integrated circuit chips 70 are electrically connected to respective ones of each of the first sets of base pads 24 included on each of the base panels 88. Such electrical connection is accomplished in the above-described manner. Subsequent to the pre-attachment of the integrated circuit chips 70 to the base panels 88 flux/underfill material is dispensed onto each of the solder bumps 67 of the transposer panel 86, with the flux/underfill material also being dispensed onto all of the solder bumps 50 of each of the frame panels 90. The transposer panel is then cooperatively engaged to a stacking fixture such that the solder balls 68 face or are directed downwardly. A spacer sheet 92 is then stacked upon the transposer panel 86 such that the transposer pads 64 of the first set of each group are aligned with respective ones of the openings 94 within the spacer sheet 92. A base panel 88 is then stacked upon the spacer sheet 92 such that the base pads 30 of the third set of each group face or are directed downwardly and are aligned with respective ones of the openings 94 and respective ones of the transposer pads 64 of the first set of the corresponding group upon the transposer panel 86 immediately therebelow. Another spacer sheet 92 is then stacked upon the base panel 88 such that the base pads 24, 26 of the first and second sets of each group are aligned with respective ones of the openings 94.

In the next step of the assembly process, a frame panel 90 is stacked upon the uppermost spacer sheet 92 such that the bodies 72 of the integrated circuit chips 70 are each circumvented by the frame panel 90. Another spacer sheet 92 is then stacked upon the frame panel 90 such that the frame pads 44 of the first set of each group are aligned with respective ones of the openings 94. Another base panel 88 is then stacked upon the uppermost spacer sheet 92 in a manner wherein the base pads 30 of the third set of each group of such uppermost base panel 88 are aligned with respective ones of the openings 94 and respective ones of the frame pads 44 of the first set of the corresponding group upon the frame panel 90 immediately therebelow. As will be recognized, the above-described stacking process may be continued or repeated to form a chip stack having a greater number of electrically interconnected integrated circuit chips 70.

Upon the stacking of the various panels and sheets in the above-described manner, a pressure plate is applied to the top of the stack to maintain such panels and sheets in prescribed orientations relative to each other. The stacked panels and sheets are then subjected to heat at a level sufficient to facilitate the reflow of the solder bumps 50, 67. The solder reflow cycle is typically conducted in a temperature range of from about 215° Celsius to about 250° Celsius. Upon the completion of solder reflow process, the individual chip stacks are separated through the use of a router.

In the preferred assembly method as discussed above, the spacer sheets 92 are needed only for the solder reflow process, and do not become part of each resultant chip stack formed by the completion of the routing process. The solder bumps 50, 67 are slightly higher than each spacer sheet 92. Since light pressure is applied to the various panels and sheets during the solder reflow process, the solder bumps 50, 67 collapse, thus making the appropriate electrical connections to the corresponding pads (i.e., the base pads 26, 30 of either the second or third sets). Thus, the spacer sheets 92 keep the solder from being squeezed out and bridging to neighboring pads. A spacing of from about four mils to about six mils can be accomplished using spacer sheets 92 which are fabricated from paper. The paper can be easily punched to form the openings 94, does not interfere with the routing process, can withstand the solder reflow temperature in the aforementioned range, and is inexpensive. The paper spacer sheets 92 would be sized the same as the transposer, base and frame panels 86, 88, 90, and punched to include openings 94 which are slightly larger than the finished, routed chip stack. With slight pressure being applied to the stacked panels and sheets, the space between the panels and sheets is easily maintained, thus eliminating the necessity to remove the spacer sheets 92 subsequent to the reflow of the solder. As indicated above, the paper spacer sheets 92 would not interfere with the routing process, and would be removed with the rest of the debris.

The present assembly method has high volume potential, with the use of the flux/underfill material providing localized encapsulation of the conductive contacts 82 of the integrated circuit chips 70 and eliminating the need for a cleaning cycle as discussed above. Those of ordinary skill in the art will recognize that a transposer panel 86 need not necessarily be included in the assembly process, since the lowermost base layer 12 in any chip stack may be used as a transposer board to facilitate the mounting or electrical connection of the chip stack to a PCB. In the completed chip stack, the solder joints between each of the integrated circuit chips 70 and the corresponding base layer 12 are protected by the flux/underfill material.

Referring now to FIG. 6, there is perspectively illustrated a chip stack 200 constructed in accordance with a second embodiment of the present invention. The chip stack 200 comprises a base layer 212 which is identically configured to the base layer 12 of the first embodiment. In this regard, the base layer 212 comprises a rectangularly configured base substrate 214 which defines a generally planar top surface 216, a generally planar bottom surface 218, an opposed pair of longitudinal peripheral edge segments 220, and an opposed pair of lateral peripheral edge segments 222.

Disposed on the base substrate 214 of the base layer 212 is a first conductive pattern which itself preferably comprises a first set of base pads 224 and a second set of base pads 226 which are each disposed on the top surface 216 of the base substrate 214. The base pads 224 of the first set are arranged in a generally rectangular pattern or array in the central portion of the base substrate 214, with the base pads 226 of the second set extending linearly along the longitudinal and lateral peripheral edge segments 220, 222 of the base substrate 214. The base pads 224 of the first set are electrically connected to respective ones of the base pads 226 of the second set via conductive traces 228. In addition to the base pads 224, 226 of the first and second sets, the first conductive pattern of the base layer 212 comprises a third set of base pads which is disposed on the bottom surface 218 of the base substrate 214. The base pads 230 of the third set are preferably arranged in an identical pattern to the base pads 226 of the second set, and extend linearly along the longitudinal and lateral peripheral edge segments 220, 222 of the base substrate 214 such that each of the base pads 230 of the third set is coaxially aligned with and electrically connected to a respective one of the base pads 226 of the second set. The electrical connection between each base pad 226 of the second set and a respective one of the base pads of the third set is accomplished by a via or feed-through hole extending through the base substrate 214 therebetween.

In addition to the base layer 212, the chip stack 200 of the second embodiment comprises at least one rectangularly configured interconnect frame 234. The interconnect frame 234 defines a generally planar top surface 236, a generally planar bottom surface 238, an opposed pair of longitudinal side sections 240, and an opposed pair of lateral side sections 242. Disposed on the interconnect frame 234 is a second conductive pattern which itself preferably comprises a first set of frame pads 244 disposed on the top surface 236, and a second set of frame pads disposed on the bottom surface 238. The frame pads 244 of the first set and the frame pads of the second set are preferably arranged in patterns which are identical to each other, and to the patterns of the second set of base pads 226 and third set of base pads. In this regard, the frame pads 244 of the first set and the frame pads of the second set each extend linearly along the longitudinal and lateral side sections 240, 242 of the interconnect frame 234. Additionally, each of the frame pads 244 of the first set is coaxially aligned with and electrically connected to a respective one of the frame pads of the second set, with such electrical connection preferably being facilitated by a via or feed-through hole extending through the interconnect frame 234 therebetween.

In the chip stack 200, the second conductive pattern of the interconnect frame 234 is electrically connected to the first conductive pattern of the base layer 212. More particularly, the frame pads 244 of the first set are electrically connected to respective ones of the base pads of the third set. The electrical connection of the second conductive pattern of the interconnect frame 234 to the first conductive pattern of the base layer 212 is preferably facilitated via a soldering process.

The chip stack 200 of the second embodiment further comprises a transposer layer 252. The transposer layer 252 itself comprises a rectangularly configured transposer substrate 254 which defines a generally planar top surface 256, a generally planar bottom surface 258, an opposed pair of longitudinal peripheral edge segments 260, and an opposed pair of lateral peripheral edge segments 262. Disposed on the transposer substrate 254 is a third conductive pattern. The third conductive pattern comprises a first set of transposer pads 264 which are disposed in the central portion of the top surface 256 in a generally rectangular pattern or array. In this regard, the transposer pads 264 of the first set are arranged in a pattern which is identical to that of the base pads 224 of the first set. The third conductive pattern further comprises a second set of transposer pads 266 which are also disposed on the top surface 256 in a generally rectangular pattern circumventing the transposer pads 264 of the first set. The transposer pads 266 of the second set are themselves arranged in a pattern which is identical to the patterns of the base pads 226 of the second set, the base pads of the third set, the frame pads 244 of the first set, and the frame pads of the second set. The transposer pads 266 of the second set are electrically connected to respective ones of the transposer pads 264 of the first set via conductive traces 265.

The third conductive pattern of the transposer substrate 254 further comprises a third set of transposer pads 267 which are disposed on the top surface 256, and are arranged in two rows which extend in spaced, parallel relation to each other along respective ones of the longitudinal peripheral edge segments 260. The transposer pads 267 of the third set are themselves electrically connected to respective ones of the transposer pads 266 of the first set via conductive traces 268. Also included in the third conductive pattern is a fourth set of transposer pads 269 which are disposed on the bottom surface 258 of the transposer substrate 254. As best seen in FIG. 8, the transposer pads 269 of the fourth set each preferably comprise an inner pad 269a and an outer pad 269b. The inner pads 269a are arranged in two rows which extend in spaced, generally parallel relation to each other in a pattern identical to that of the transposer pads 267 of the third set. In this regard, each of the transposer pads 267 of the third set is coaxially aligned with and electrically connected to a respective one of the inner pads 269a by a via or feed-through hole extending through the transposer substrate 254 therebetween. The outer pads 269b of each of the transposer pads 269 of the fourth set are themselves arranged in two rows which extend in spaced, generally parallel relation to each other along respective ones of the longitudinal peripheral edge segments 260 of the transposer substrate 254. As further seen in FIG. 8, each outer pad 269b is electrically connected to a respective one of the inner pads 269a via a conductive trace 269c. In the transposer layer 252, the transposer pads 269 of the fourth set, and more particularly the outer pads 269b thereof, are adapted to mimic a TSOP (thin small outline package) interface.

The chip stack 200 of the second embodiment further comprises at least two identically configured integrated circuit chip packages 270. One of the integrated circuit chip packages 270 is electrically connected to the first conductive pattern of the base layers 212, with the remaining integrated circuit chip package 270 being electrically connected to the third conductive pattern of the transposer layer 252. Each of the integrated circuit chip packages 270 comprises a rectangularly configured package body 272 defining opposed, generally planar top and bottom surfaces, an opposed pair of longitudinal sides, and an opposed pair of lateral sides. Disposed on the bottom surface of the package body 272 are a plurality of spherically or semi-spherically shaped conductive contacts which are preferably arranged in a pattern identical to the patterns of the base pads 224 of the first set and the transposer pads 264 of the first set. The conductive contacts of one of the integrated circuit chip packages 270 are electrically connected to respective ones of the base pads 224 of the first set of the base layer 212, with the conductive contacts of the remaining integrated circuit chip package 270 being electrically connected to respective ones of the transposer pads 264 of the first set of the transposer layer 252. Such electrical connection is preferably accomplished via soldering. Each of the integrated circuit chip packages 270 is preferably a CSP (chip scale package) device such as a BGA (ball grid array) device, a fine pitch BGA device, or a flip chip device.

In assembling the chip stack 200 of the second embodiment, one of the integrated circuit chip packages 270 is electrically connected to the first conductive pattern of the base layer 212 in the above-described manner, with the remaining integrated circuit chip package 270 being electrically connected to the third conductive pattern of the transposer layer 252 in the above-described manner. The second conductive pattern of the interconnect frame 234 is then electrically connected to the first conductive pattern of the base layer 212 in the above-described manner. Thereafter, the second conductive pattern of the interconnect frame 234 is itself electrically connected to the third conductive pattern of the transposer layer 252. More particularly, each of the frame pads of the second set is coaxially aligned with and electrically connected to a respective one of the transposer pads 266 of the second set which are arranged in an identical pattern as indicated above. Such electrical connection is also preferably facilitated via soldering. Those of ordinary skill in the art will recognize that the assembly sequence described above may be altered in assembling the chip stack 200 of the second embodiment.

When the second conductive pattern of the interconnect frame 234 is electrically connected to the third conductive pattern of the transposer layer 252, the lowermost integrated circuit chip package 270 of the chip stack 200 is circumvented by the interconnect frame 234 and disposed between (i.e., covered by) the base and transposer layers 212, 252. The interconnect frame 234 is itself disposed between and partially covered by the base and transposer layers 212, 252. The package body 272 of each integrated circuit chip package 270 is preferably sized relative to the interconnect frame 234 such that the top surface of the package body 272 of the integrated circuit chip package 270 which is circumvented by the interconnect frame 234 does not protrude beyond the top surface 236 thereof.

The configuration of the chip stack 200, and in particular the transposer layer 252 thereof, provides a CSP-TSOP interface. In this regard, the configuration of the third conductive pattern of the transposer layer 252 provides a TSOP "footprint" for the integrated circuit chip packages 270 which each preferably comprise a CSP device and are electrically connected to each other in a desired fashion through the use of the base and transposer layers 212, 252 and intermediate interconnect frame 234.

Figure 9:
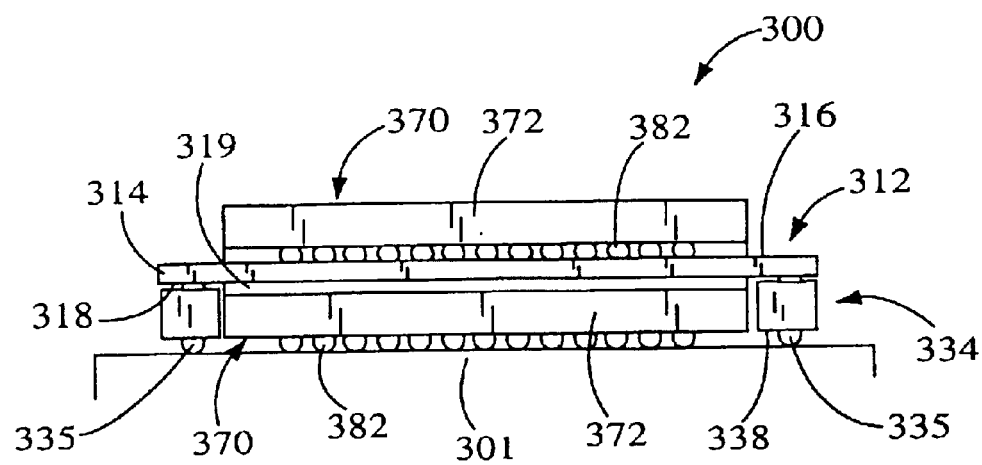
FIG. 9 is a side-elevational view of a chip stack constructed in accordance with a third embodiment of the present invention.

Referring now to FIG. 9, there is shown a chip stack 300 constructed in accordance with a third embodiment of the present invention. The chip stack 300 comprises a base layer 312 which is identically configured to the base layer 212 of the chip stack 200 of the second embodiment. Also included in the chip stack 300 is an interconnect frame 334 which is identically configured to the interconnect frame 234 of the chip stack 200 of the second embodiment. In the chip stack 300, the first conductive pattern of the base layer 312 is electrically connected to the second conductive pattern of the interconnect frame 334 in the same manner previously described in relation to the electrical connection of the first conductive pattern of the base layer 212 to the second conductive pattern of the interconnect frame 234. The interconnect frame 334 of the chip stack 300 preferably includes solder balls 335 which are formed on respective ones of the frame pads of the second set of the second conductive pattern thereon for reasons which will be described in more detail below.

The chip stack 300 of the third embodiment further comprises two identically configured integrated circuit chip packages 370 which are identical to the integrated circuit chip packages 270 of the second embodiment, and each preferably comprise a package body 372 having a plurality of conductive contacts 382 disposed on the bottom surface thereof. Like the integrated circuit chip packages 270, each of the integrated circuit chip packages 370 preferably comprises a CSP device such as a BGA device, a fine pitch BGA device, or a flip chip device.

In the chip stack 300 of the third embodiment, the conductive contacts 382 of one of the integrated circuit chip packages 370 are electrically connected to the first conductive pattern of the base layer 312 in the same manner previously described in relation to the electrical connection of one of the integrated circuit chip packages 270 to the first conductive pattern of the base layer 212 in the chip stack 200. The remaining integrated circuit chip package 370 in the chip stack 300 (i.e., the lowermost integrated circuit chip package 370 in the chip stack 300) is attached to the bottom surface 318 of the base substrate 314 of the base layer 312. More particularly, the top surface of the package body 372 of the lowermost integrated circuit chip package 370 is rigidly affixed to the bottom surface 318 via an adhesive layer 319. Such attachment is preferably facilitated such that the bottom surface of the package body 372 of the lowermost integrated circuit chip package 370 is substantially flush with the bottom surface 338 of the interconnect frame 334. Additionally, the solder balls 335 are preferably formed to have the same basic dimensions as the conductive contacts 382 of the lowermost integrated circuit chip package 370. Thus, in the chip stack 300 of the third embodiment, the solder balls 335 and the conductive contacts 382 of the lowermost integrated circuit chip package 370 collectively define a composite footprint for the chip stack 300 which is electrically connectable to an underlying component such as a printed circuit board 301.

The chip stack 300 of the third embodiment is preferably assembled by initially electrically connecting one of the integrated circuit chip packages 370 to the first conductive pattern of the base layer 312 in the above-described manner, and thereafter securing the remaining integrated circuit chip package 370 to the bottom surface 318 of the base substrate 314 of the base layer 312 in the above-described manner. Thereafter, the second conductive pattern of the interconnect frame 334 is electrically connected to the first conductive pattern of the base layer 312 in the above-described manner. The package body 372 of each of the integrated circuit chip packages 370 and the interconnect frame 334 are preferably sized relative to each other such that the bottom surface of the package body 372 of the integrated circuit chip package 370 which is circumvented by the interconnect frame 334 (i.e., the lowermost integrated circuit chip package 370 in the chip stack 300) does not protrude beyond the bottom surface 338 of the interconnect frame 334. Those of ordinary skill in the art will recognize that an assembly sequence varying from that described above may be employed for use in relation to the chip stack 300 of the third embodiment.

Additionally, if desired, a layer of flux/underfill material may be applied between the bottom surface of the package body 372 of the uppermost integrated circuit chip package 370 and the top surface 316 of the base substrate 314 of the base layer 312. It will be recognized that the chip stack 300 may be used in conjunction with (i.e., electrically connected to) the above-described transposer layer 252 of the chip stack 200 of the second embodiment. In this regard, the solder balls 335 could be electrically connected to respective ones of the transposer pads 266 of the second set, with the conductive contacts 382 of the lowermost integrated circuit chip package 370 being electrically connected to respective ones of the transposer pads 264 of the first set. The transposer layer 252, if used in combination with the chip stack 300, would provide the above-described CSP-TSOP interface.

Figure 10:
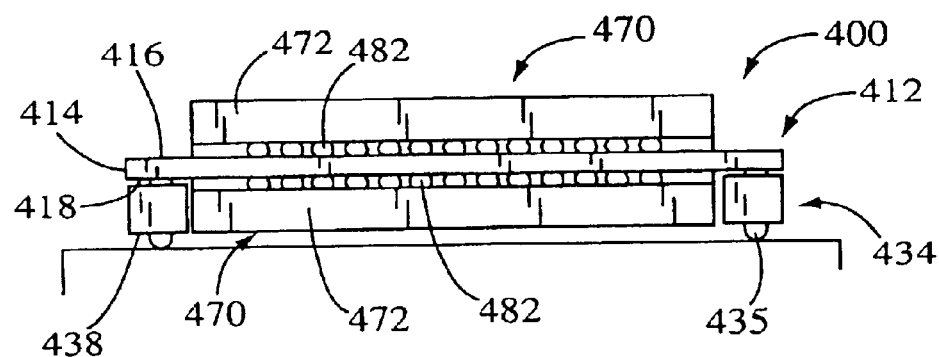
FIG. 10 is a side-elevational view of a chip stack constructed in accordance with a fourth embodiment of the present invention.

Referring now to FIG. 10, there is shown a chip stack 400 constructed in accordance with a fourth embodiment of the present invention. The chip stack 400 of the fourth embodiment comprises a base layer 412. The base layer 412 of the chip stack 400 is identically configured to the base layer 312 of the chip stack 300, but further includes a fourth set of base pads which are disposed in a generally rectangular pattern or array upon the central portion of the bottom surface 418 of the base substrate 414 of the base layer 412. In this regard, the base pads of the fourth set are preferably arranged in an identical pattern to the base pads of the first set of the base layer 412. The base pads of the fourth set are electrically connected to respective ones of the base pads of the third set (which are also disposed on the bottom surface 418) via conductive traces.

The chip stack 400 of the fourth embodiment further comprises an interconnect frame 434 which is identically configured to the interconnect frame 334 of the chip stack 300. In the chip stack 400, the first conductive pattern of the base layer 412 is electrically connected to the second conductive pattern of the interconnect frame 434 in the same manner previously described in relation to the electrical connection of the first conductive pattern of the base layer 212 to the second conductive pattern of the interconnect frame 234. The interconnect frame 434 of the chip stack 400 also preferably includes solder balls 435 which are formed on respective ones of the frame pads of the second set of the second conductive pattern thereon.

The chip stack 400 of the fourth embodiment further comprises two identically configured integrated circuit chip packages 470 which are identical to the integrated circuit chip packages 370 of the third embodiment, and each preferably comprise a package body 472 having a plurality of conductive contacts 482 disposed on the bottom surface thereof. Each of the integrated circuit chip packages 470 also preferably comprises a CSP device such as a BGA device, a fine pitch BGA device, or a flip chip device.

In the chip stack 400 of the fourth embodiment, the conductive contacts 482 of each of the integrated circuit chip packages 470 are electrically connected to the first conductive pattern of the base layer 412. More particularly, the conductive contacts 382 of the uppermost integrated circuit chip package 470 are electrically connected to respective ones of the base pads of the first set of the base layer 412, with the conductive contacts 482 of the lowermost integrated circuit chip package 470 in the chip stack 400 being electrically connected to respective ones of the base cads of the fourth set of the base layer 412. The lowermost integrated circuit chip package 470 is circumvented by the interconnect frame 434. The package body 472 of each of the integrated circuit chip packages 470 and the interconnect frame 434 are preferably sized relative to each other such that the bottom surface of the package body 472 of the integrated circuit chip package 470 which is circumvented by the interconnect frame 434 (i.e., the lowermost integrated circuit chip package 470 in the chip stack 400) does not protrude beyond the bottom surface 438 of the interconnect frame 434.

The chip stack 400 of the fourth embodiment is preferably assembled by initially electrically connecting each of the integrated circuit chip packages 470 to the first conductive pattern of the base layer 412 in the above-described manner. Thereafter, the second conductive pattern of the interconnect frame 434 is electrically connected to the first conductive pattern of the base layer 412 in the above-described manner. Those of ordinary skill in the art will recognize that an assembly sequence varying from that described above may be employed for use in relation to the chip stack 400 of the fourth embodiment. Additionally, if desired, a layer of flux/underfill material may be applied between the bottom surface of the package body 472 of each of the integrated circuit chip packages 470 and respective ones of the top and bottom surfaces 416, 418 of the base substrate 414 of the base layer 412.

Additional modifications and improvements of the present invention may also be apparent to those of ordinary skill in the art. Thus, the particular combination of parts and steps described and illustrated herein is intended to represent only one embodiment of the present invention, and is not intended to serve as limitations of alternative devices and methods within the spirit and scope of the invention.

What is claimed is:

1. A method of assembling a chip stack, comprising the steps of:
    a) electrically connecting an integrated circuit chip package to a first conductive pattern of a base layer;
    b) electrically connecting a second conductive pattern of an interconnect frame to the first conductive pattern;
    c) electrically connecting another integrated circuit chip package to a third conductive pattern of a transposer layer; and
    d) electrically connecting the second conductive pattern of the interconnect frame to the third conductive pattern of the transposer layer such that one of the integrated circuit chip packages is at least partially circumvented by the interconnect frame.

2. A method of assembling a chip stack, comprising the steps of:
    a) electrically connecting an integrated circuit chip package to a first conductive pattern of a base layer;
    b) attaching a second integrated circuit chip packages to the base layer; and
    c) electrically connecting a second conductive pattern of an interconnect frame to the first conductive pattern such that the interconnect frame at least partially circumvents the second integrated circuit chip package.

3. The method of claim 2 wherein step (b) is accomplished through the use of an adhesive.

4. The method of claim 2 wherein step (c) comprises orienting the interconnect frame such that the second integrated circuit chip package and the second conductive pattern of the interconnect frame collectively define a composite footprint electrically connectable to another component.

5. A method of assembling a chip stack, comprising the steps of:
    a) electrically connecting an integrated circuit chip package to a first conductive pattern of a base layer;

b) electrically connecting another integrated circuit chip package to the first conductive pattern of the base layer; and c) electrically connecting a second conductive pattern of an interconnect frame to the first conductive pattern such that the interconnect frame at least partially circumvents one of the integrated circuit chip packages.

6. The method of claim 5 wherein:

step (a) comprises positioning one of the integrated circuit chip packages upon a top surface of the base layer;

step (b) comprises positioning one of the integrated circuit chip packages upon a bottom surface of the base layer; and step (c) comprises electrically connecting the second conductive pattern of the interconnect frame to the first conductive pattern of the base layer such that the interconnect frame at least partially circumvents the integrated circuit chip package positioned upon the bottom surface of the base layer.

* * * * *